US011092996B2

(12) United States Patent
Lee et al.

(10) Patent No.: US 11,092,996 B2
(45) Date of Patent: Aug. 17, 2021

(54) ELECTRONIC DEVICE

(71) Applicant: GETAC TECHNOLOGY CORPORATION, Hsinchu County (TW)

(72) Inventors: Kun-Cheng Lee, Taipei (TW); Juei-Chi Chang, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/893,369

(22) Filed: Jun. 4, 2020

(65) Prior Publication Data

US 2021/0055768 A1 Feb. 25, 2021

Related U.S. Application Data

(60) Provisional application No. 62/889,266, filed on Aug. 20, 2019.

(51) Int. Cl.

| G06F 1/16 | (2006.01) |
|---|---|
| H02G 11/00 | (2006.01) |
| H02G 15/10 | (2006.01) |
| H02G 15/18 | (2006.01) |
| H05K 7/02 | (2006.01) |
| H05K 7/14 | (2006.01) |
| G06F 1/18 | (2006.01) |
| H05K 5/02 | (2006.01) |
| H05K 5/03 | (2006.01) |

(52) U.S. Cl.
CPC .......... G06F 1/1616 (2013.01); G06F 1/1656 (2013.01); G06F 1/183 (2013.01); H02G 11/00 (2013.01); H02G 15/10 (2013.01); H02G 15/18 (2013.01); H05K 5/023 (2013.01); H05K 5/03 (2013.01); H05K 7/02 (2013.01); H05K 7/1417 (2013.01)

(58) Field of Classification Search
CPC .. G06K 7/0073; H05K 7/0021; H05K 7/1409; H05K 7/0043; H05K 7/0065; H05K 7/0286; G06F 1/1656; G06F 1/1658; G06F 1/183; G06F 1/187
See application file for complete search history.

(56) References Cited

U.S. PATENT DOCUMENTS 6,137,710 A * 10/2000 Iwasaki ................. H01R 27/02
365/52
6,223,250 B1 * 4/2001 Yokono ................... G06F 1/181
710/104

(Continued)

*Primary Examiner* — Anthony Q Edwards

(57) ABSTRACT

The present invention discloses an electronic device including a carrier module, a first storage module and a second storage module. The carrier module includes a first slot and a second slot. The first slot has a first shape feature, and the second slot has a second shape feature, wherein the first shape feature is different from the second shape feature. The first storage module is detachably disposed in the first slot, and has a third shape feature corresponding to the first shape feature. The second storage module is detachably disposed in the second slot, and has a fourth shape feature corresponding to the second shape feature. The third shape feature is different from the fourth shape feature.

7 Claims, 15 Drawing Sheets

(56) References Cited

U.S. PATENT DOCUMENTS

| | | | | |
|---|---|---|---|---|
| 6,549,424 B1* | 4/2003 | Beseth | ............... | H05K 7/1409 |
| | | | | 361/726 |
| 9,826,657 B2* | 11/2017 | Killen | ............... | H05K 7/1489 |
| 10,064,305 B1* | 8/2018 | Zhai | ............... | H05K 7/1425 |
| 10,283,170 B2* | 5/2019 | Tuma | ............... | G06F 1/18 |
| 2002/0012238 A1* | 1/2002 | Takahashi | ............ | G02B 6/4452 |
| | | | | 361/796 |
| 2006/0209507 A1* | 9/2006 | Sidle | ............... | G06F 1/187 |
| | | | | 361/679.4 |
| 2008/0099558 A1* | 5/2008 | Hung | ............... | G06K 7/0021 |
| | | | | 235/440 |
| 2014/0306011 A1* | 10/2014 | Chen | ............... | G06K 7/0073 |
| | | | | 235/441 |
| 2015/0333422 A1* | 11/2015 | Lee | ............... | G06K 7/0056 |
| | | | | 439/159 |

* cited by examiner

ELECTRONIC DEVICE

CROSS-REFERENCE TO RELATED APPLICATIONS

The present application claims the benefit of U.S. provisional Patent Application No. 62/889,266, filed on Aug. 20, 2019, the disclosure of which is hereby incorporated by reference herein in its entirety.

BACKGROUND OF THE INVENTION

Field of the Invention

The present invention relates to an electronic device and, more particularly, to an electronic device including at least two mutually independent storage modules.

Description of the Prior Art

An electronic device (for example, a laptop computer) of the prior art usually supports only a fixed hard drive attached on a mainboard and a removable hard drive. When the laptop computer malfunctions and the maintenance is thus needed, the fixed hard drive attached on the mainboard may result in an information security loophole if it is not removed.

Furthermore, a fixed hard drive attached on the mainboard inevitably involves complexity of the disassembly and assembly, such that a user is required to carry along the laptop computer in an application environment that demands information security, hence it easily causes inconvenience to the user.

Therefore, it is one critical task of the related field to provide an improved structural design for enhancing protection for information security and for overcoming the drawbacks above.

SUMMARY OF THE INVENTION

It is a technical issue of the present invention that providing an electronic device with respect to drawbacks of the prior art.

To solve the foregoing technical issue, an electronic device is provided according to one technical solution adopted by the present invention. The electronic device includes a carrier module, a first storage module and a second storage module. The carrier module includes a first slot and a second slot. The first slot has a first shape feature, and the second slot has a second shape feature, wherein the first shape feature is different from the second shape feature. The first storage module is detachably disposed in the first slot, and has a third shape feature corresponding to the first shape feature. The second storage module is detachably disposed in the second slot, and has a fourth shape feature corresponding to the second shape feature. Wherein, the third shape feature is different from the fourth shape feature.

One benefit of the present invention is that, the electronic device provided by the present invention allows a user to easily distinguish the differences between the first storage module and the second storage module by the technical solutions "the first slot has a first shape feature, and the second slot has a second shape feature, wherein the first shape feature is different from the second shape feature," "the first storage module has a third shape feature corresponding to the first shape feature," "the second storage module has a fourth shape feature corresponding to the second shape feature," and "the third shape feature is different from the fourth shape feature," and at the same time enhances protection and convenience for information security.

To further understand the features and technical contents of the present invention, please refer to detailed description and the accompanying drawings of the present invention below. It should be noted that, the drawings are provided for reference and illustration purposes, and shall not be construed as limitations to the present invention.

DETAILED DESCRIPTION OF THE EMBODIMENTS

Implementation forms related to "an electronic device" disclosed by the present invention are described by way of specific embodiments below for a person skilled in the art to understand the advantages and effects of the present invention on the basis of the disclosure of the present application. The present invention may be implemented or applied by using other different specific embodiments, and various modifications and changes may also be made to the details in the description on the basis of different perspectives and applications, without departing from the concept of the present invention. Furthermore, it is to be noted that the accompanying drawings of the present invention are simple illustration, and are not drawn to actual scales. Detailed Description below will further describe the related technical contents of the present invention, but the disclosed contents are not limitations to the legal protection for the present invention. In addition, although terms such as "first", "second" and "third" may be used in the disclosure to describe various elements, it should be understood that these elements are not limited by the terms used, as these terms are primarily for differentiate one element from another. Moreover, the term "or" used in the disclosure may include any or multiple combinations of the related listed items, depending on actual conditions.

Embodiments

Figure 1:
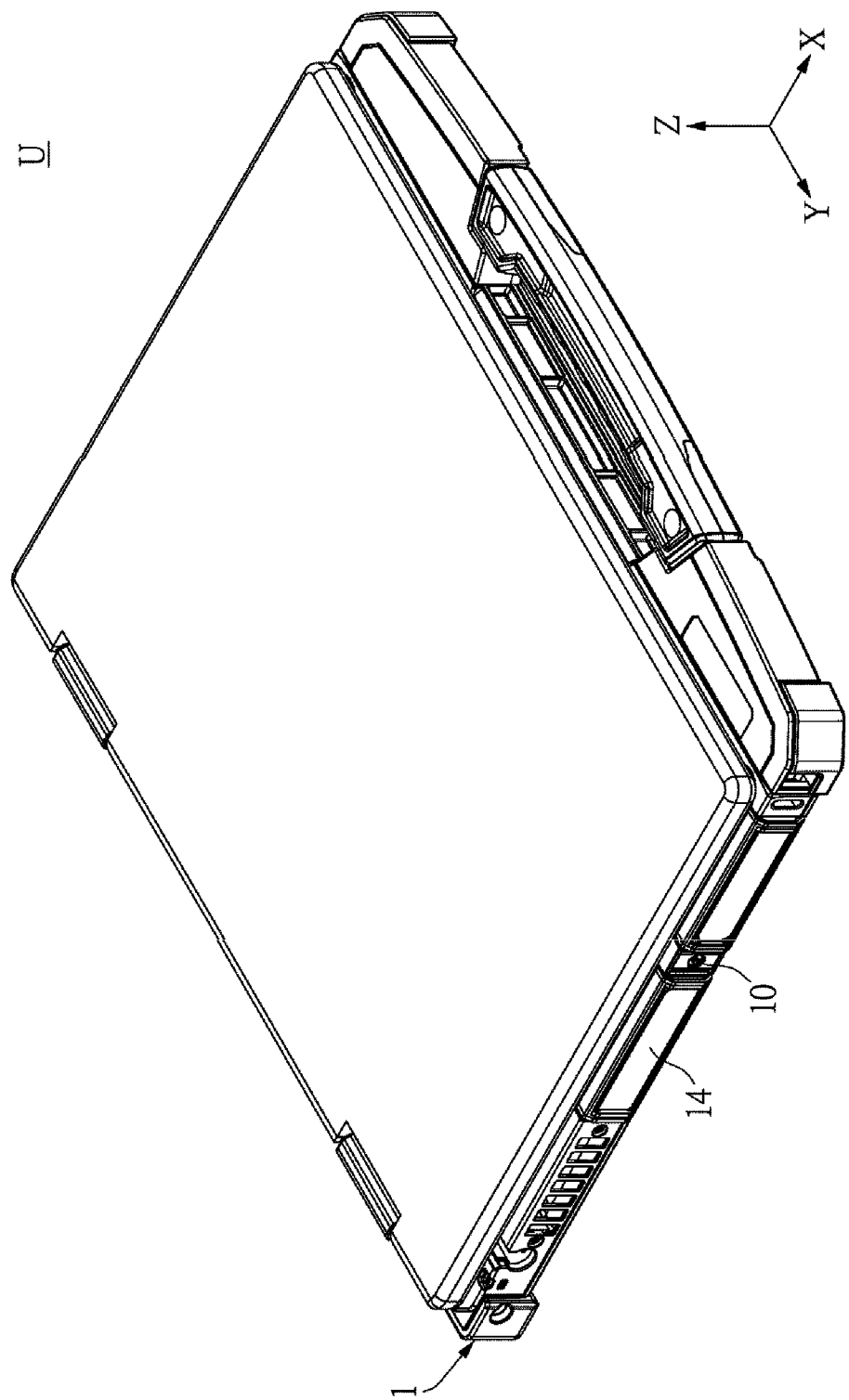
FIG. 1 is a three-dimensional schematic diagram of an electronic device according to an embodiment of the present invention.
Figure 2:
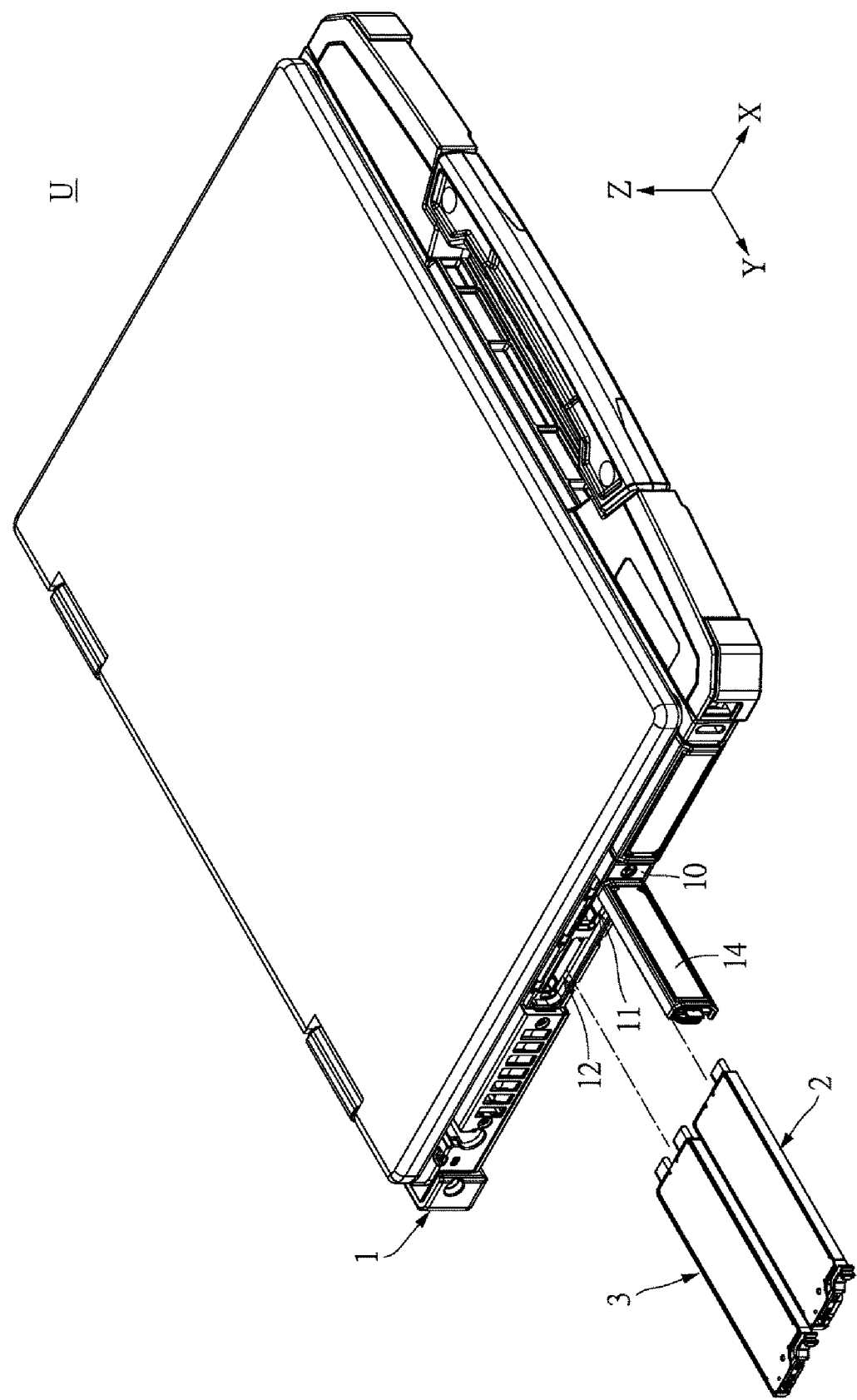
FIG. 2 is a schematic diagram of one state of use of an electronic device according to an embodiment of the present invention.
Figure 3:
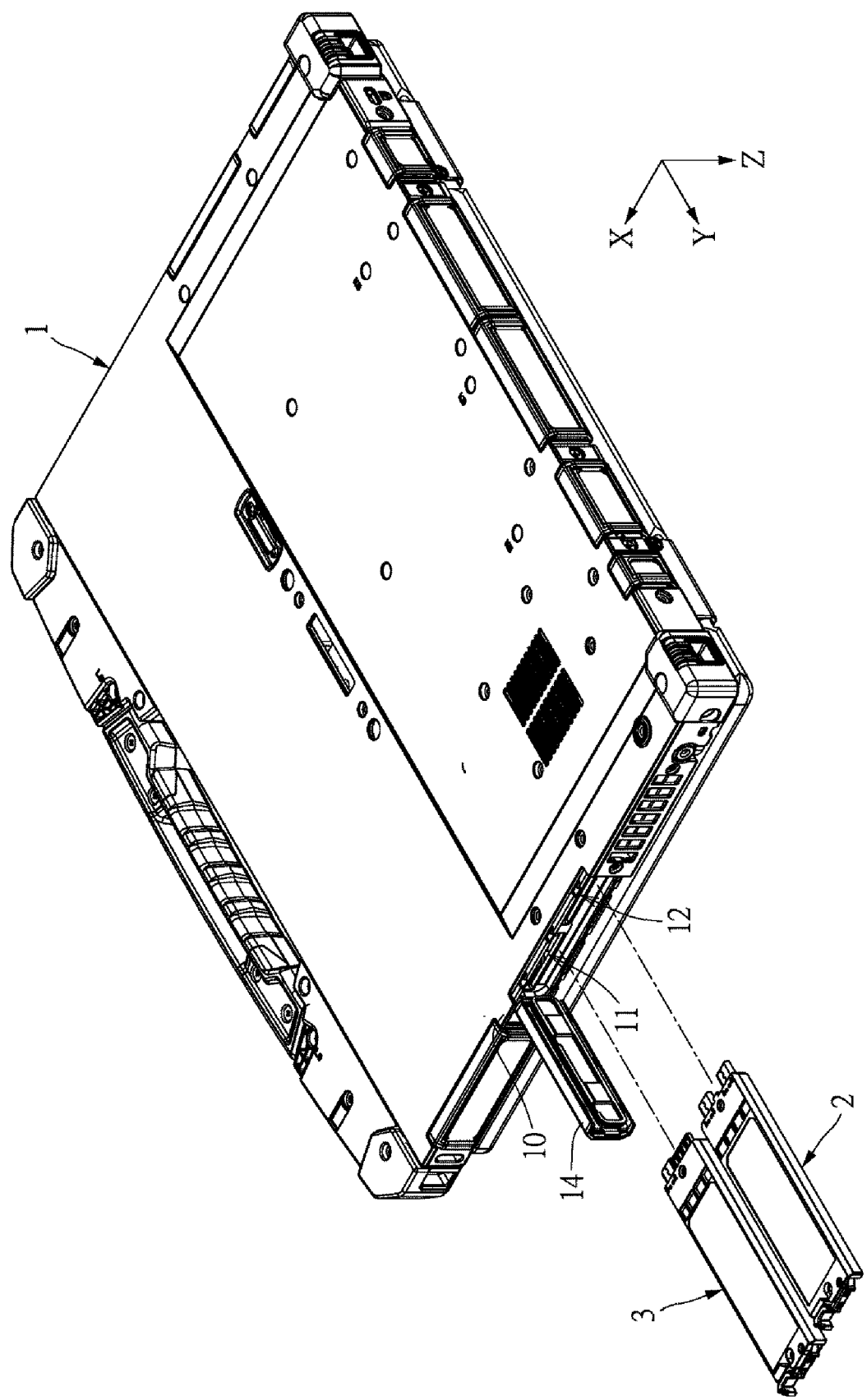
FIG. 3 is a schematic diagram of another state of use of an electronic device according to an embodiment of the present invention.

Refer to FIG. 1 to FIG. 3. FIG. 1 shows a three-dimensional schematic diagram of an electronic device according to an embodiment of the present invention. FIG. 2 and FIG. 3 are respectively schematic diagrams of states of use of an electronic device according to embodiments of the present invention. An electronic device U is provided according to an embodiment of the present invention. The electronic device U includes a carrier module 1, a first storage module 2 and a second storage module 3. In one embodiment, the electronic device U may be a laptop computer, and the carrier module 1, the first storage module 2 and the second storage module 3 may be storage devices for storing digital information in the laptop computer. In other words, the electronic device U provided according to an embodiment of the present invention may at least include two mutually independent storage modules, that is, the first storage module 2 and the second storage module 3 are different storage modules. Furthermore, the first storage module 2 and the second storage module 3 are detachably (or referred to as pluggably or removably) disposed on the carrier module 1. For example, the first storage module 2 and the second storage module 3 are pluggably disposed on the carrier module 1. Thus, with respect to the present invention, a user may directly plug/unplug the first storage module 2 and/or the second storage module 3 so as to assemble or disassemble the first storage module 2 and/or the second storage module 3. Furthermore, it should be noted that, the present invention is not limited to whether the first storage module 2 and the second storage module 3 are applied to a laptop computer.

For example, the carrier module 1 may be a housing of the laptop computer, each of the first storage module 2 and the second storage module 3 may be a solid-state drive (SSD), the standards of the first storage module 2 and the second storage module 3 may be SATA, mSATA, M.2 or PCIe, and the standards of the first storage module 2 and the second storage module 3 may be, for example but not limited to, identical to or different from each other. In addition, it should be noted that, although the connection terminals of the first storage module 2 and the second storage module 3 in the drawings are Universal Serial Bus (USB) connectors of a Type-C standard interface, the connection terminals of the first storage module 2 and the second storage module 3 in other embodiments may also be Type-A or Type-B connectors; the present invention does not limit the form of the connectors.

Figure 4:
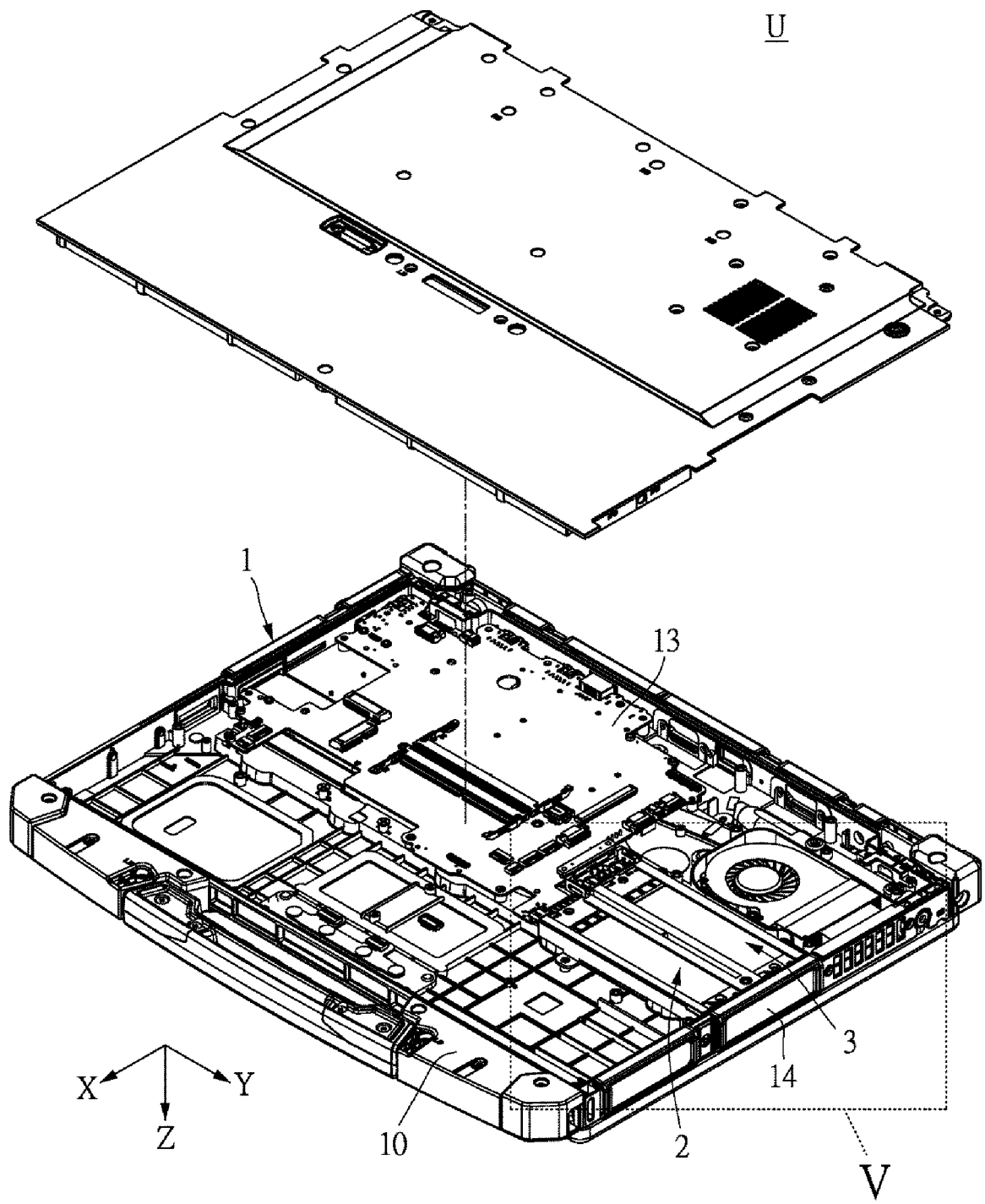
FIG. 4 is one three-dimensional exploded schematic diagram of an electronic device according to an embodiment of the present invention.
Figure 5:
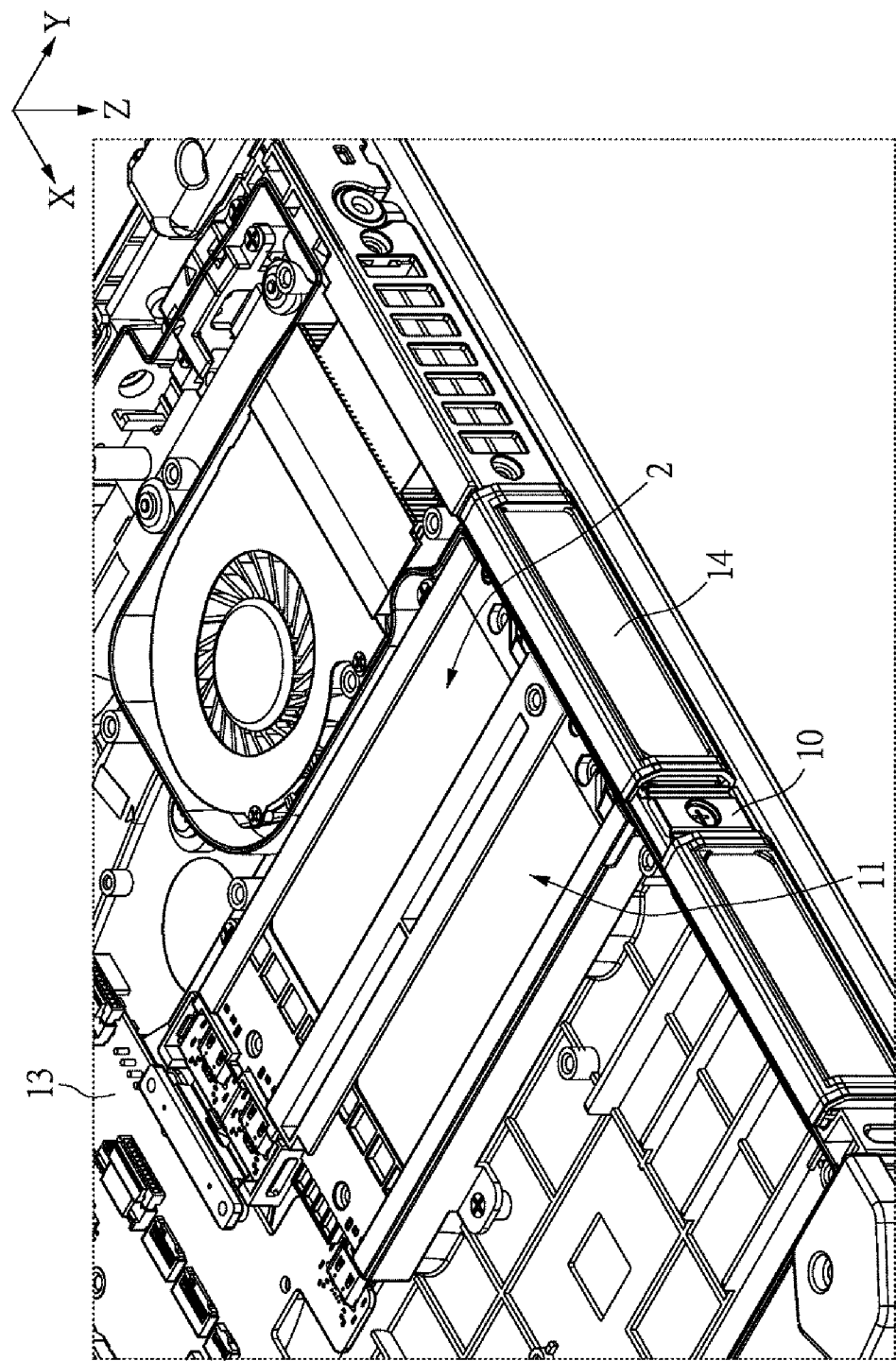
FIG. 5 is an enlarged schematic diagram of part V in FIG. 4.
Figure 6:
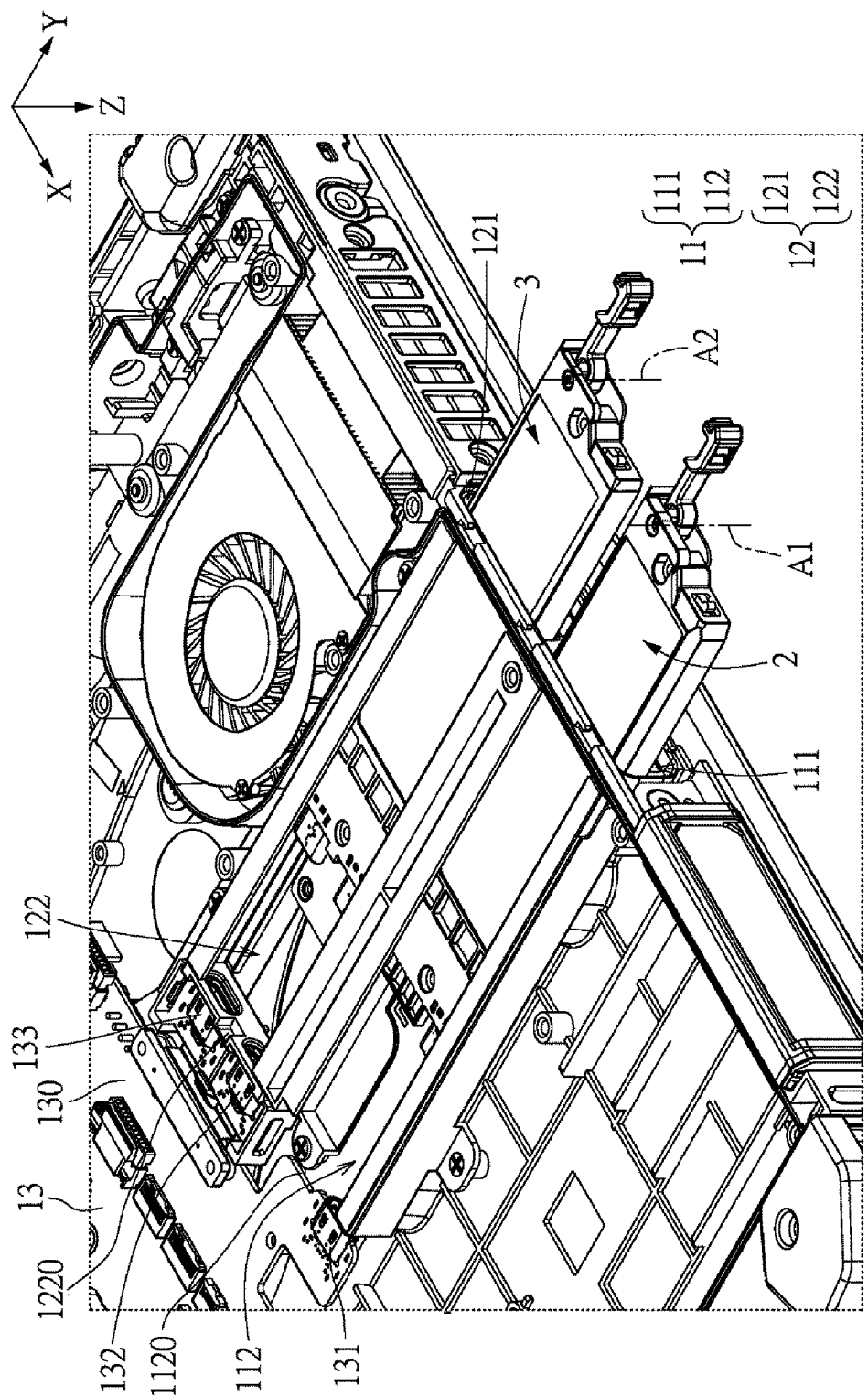
FIG. 6 is a schematic diagram of one state of use of the electronic device in FIG. 5.
Figure 7:
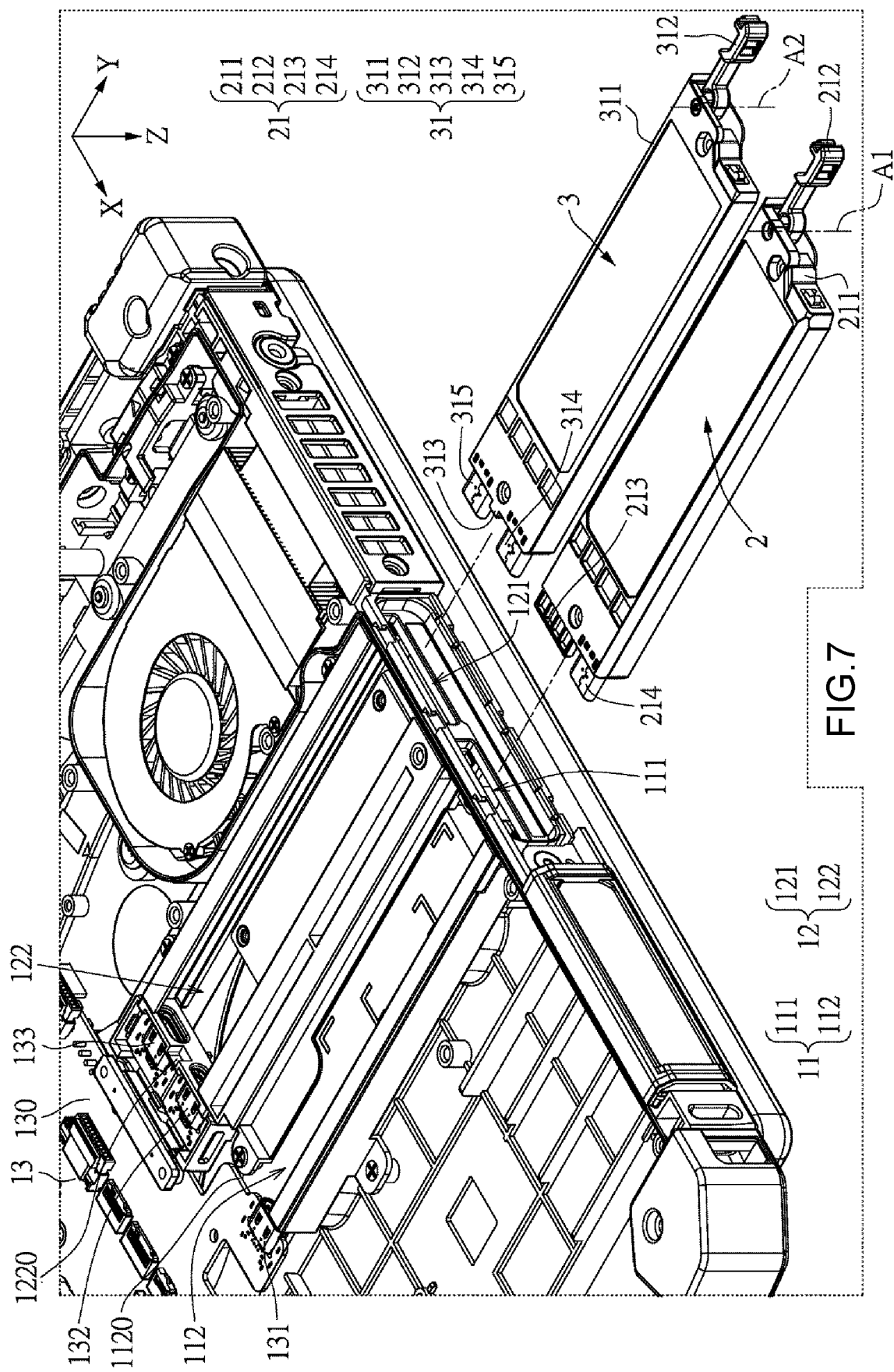
FIG. 7 is a schematic diagram of another state of use of the electronic device in FIG. 5.

Again refer to FIG. 2 and FIG. 3, as well as FIG. 4 and FIG. 7. FIG. 4 shows a three-dimensional exploded schematic diagram of an electronic device according to an embodiment of the present invention. FIG. 5 shows an enlarged schematic diagram of part V in FIG. 4. FIG. 6 and FIG. 7 show schematic diagrams of states of use of the electronic device in FIG. 5, respectively. The carrier module 1 includes a host body 10, a first slot 11 provided on the host body 10, a second slot 12 provided on the host body 10, and a circuit board 13 provided on the host body 10. The first storage module 2 is detachably disposed in the first slot 11, and the second storage module 3 is detachably disposed in the second slot 12. That is, the first storage module 2 may be slidably plugged in the first slot 11 along a predetermined direction (a negative Y direction) or be unplugged from the first slot 11 along the reverse direction of the predetermined direction (the negative Y direction), and the second storage module 3 may be slidably plugged in the second slot 12 along a predetermined direction (a negative Y direction) or be unplugged from the second slot 12 along the reverse direction of the predetermined direction (the negative Y direction). Thus, when the first storage module 2 is disposed in the first slot 11, the first storage module 2 may be electrically connected to the circuit board 13, and when the second storage module 3 is disposed in the second slot 12, the second storage module 3 may be electrically connected to the circuit board 13. That is to say, the first slot 11 and the second slot 12 have functions of guiding the first storage module 2 and the second storage module 3 to slide therein, allowing the first storage module 2 and the second storage module 3 to be electrically connected to the circuit board 13.

Figure 8:
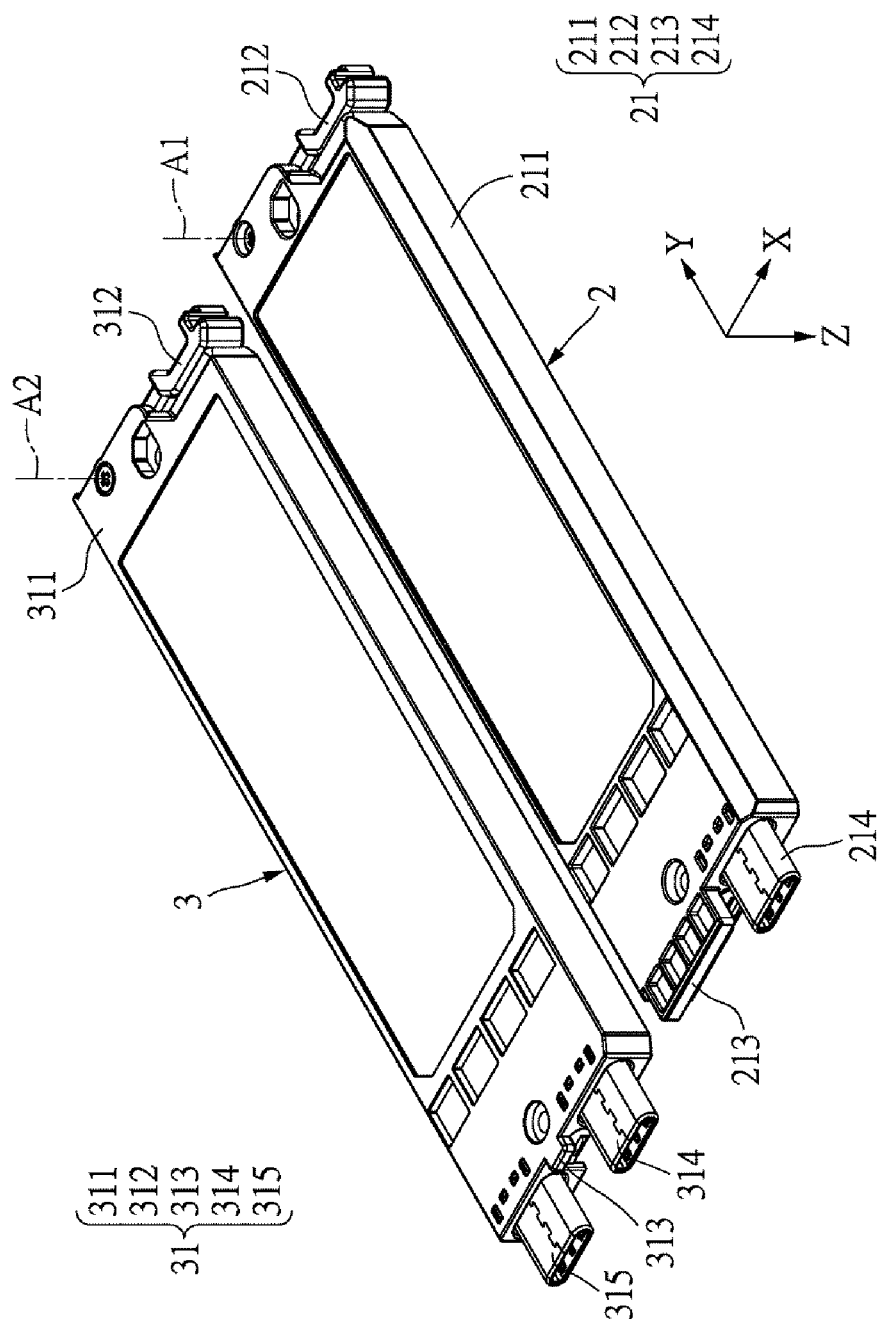
FIG. 8 is one three-dimensional schematic diagram of a first storage module and a second storage module of an electronic device according to an embodiment of the present invention.
Figure 9:
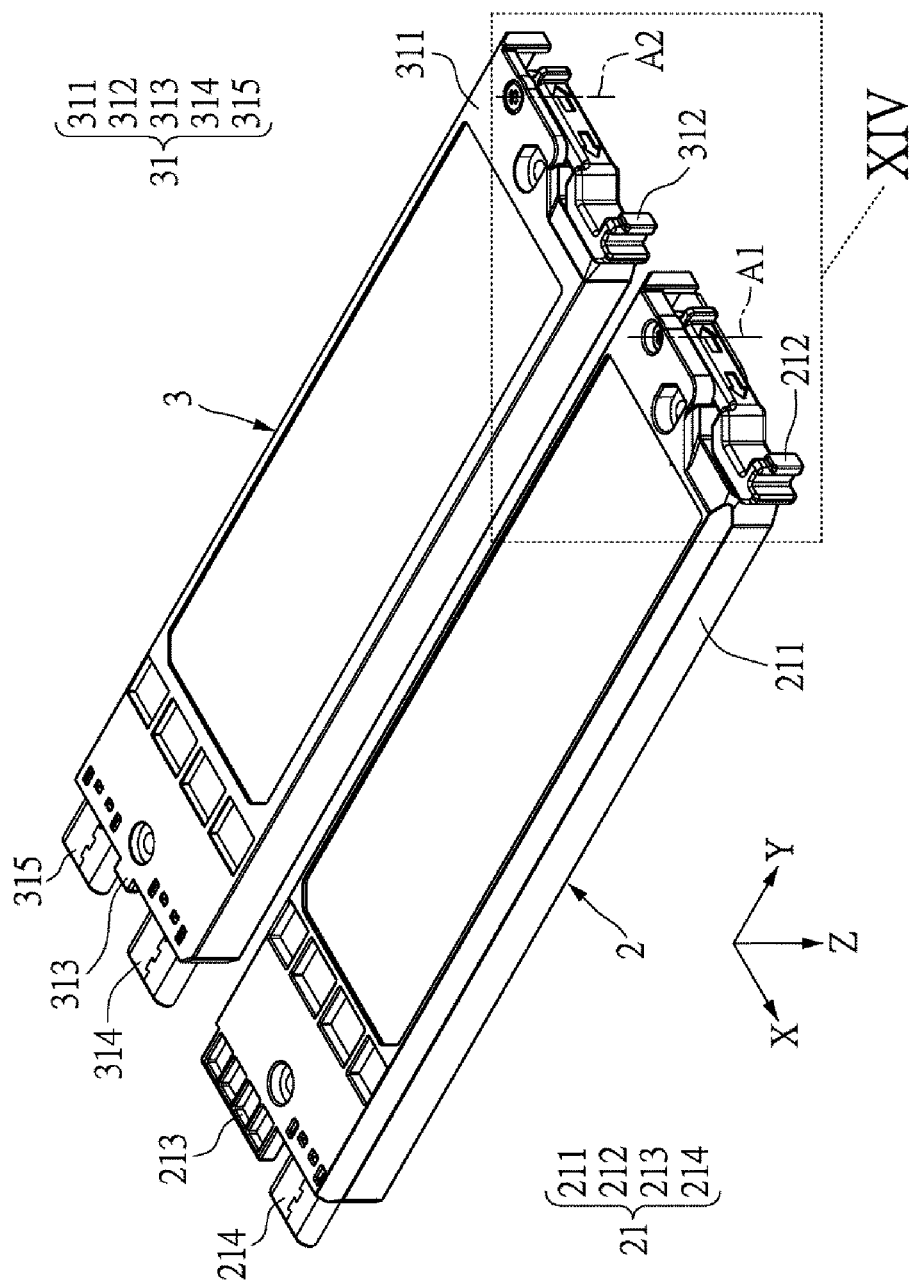
FIG. 9 is another three-dimensional schematic diagram of a first storage module and a second storage module of an electronic device according to an embodiment of the present invention.
Figure 10:
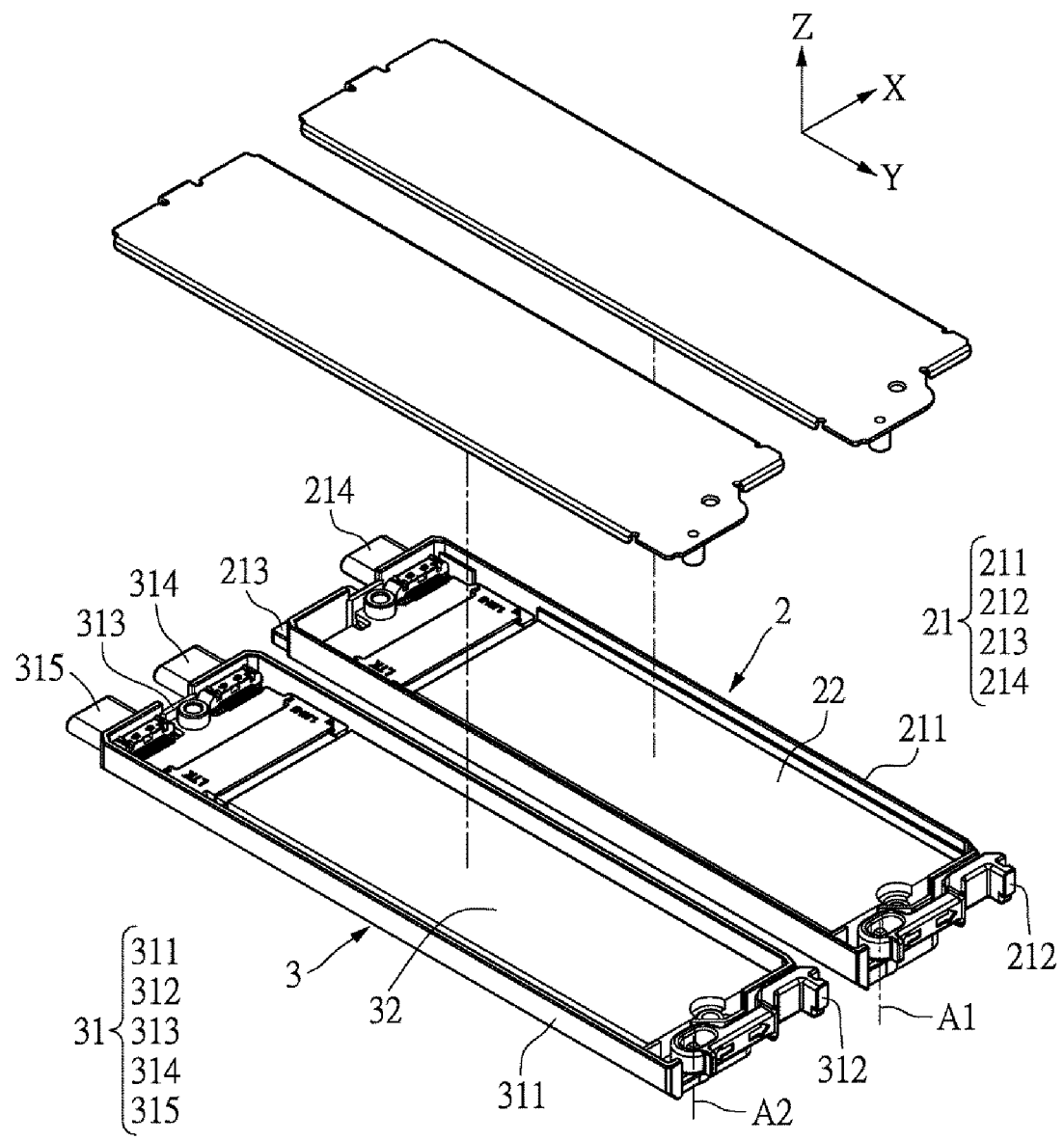
FIG. 10 is a three-dimensional exploded schematic diagram of a first storage module and a second storage module of an electronic device according to an embodiment of the present invention.

Again refer to FIG. 5 to FIG. 7, as well as FIG. 8 to FIG. 10. FIG. 5 to FIG. 7 show schematic diagrams of states of use of unplugging the first storage module 2 and the second storage module 3 from the first slot 11 and the second slot 12, respectively. FIG. 8 and FIG. 9 show three-dimensional schematic diagrams of a first storage module and a second storage module of an electronic device according to an embodiment of the present invention, respectively. FIG. 10 shows a three-dimensional exploded schematic diagram of a first storage module and a second storage module of an electronic device according to an embodiment of the present invention. For example, the first storage module 2 includes a first frame 21 and a first storage unit 22 provided on the first frame 21, and the second storage module 3 includes a second frame 31 and a second storage unit 32 provided on the second frame 31. That is, each of the first storage unit 22 and the second storage unit 32 is a chipset in an SSD, and the first frame 21 and the second frame 31 are configured to bear the first storage unit 22 and the second storage unit 32, respectively.

For example, in one embodiment, the first frame 21 and the second frame 31 may be made of different materials. That is to say, if the standards of the first storage unit 22 and the second storage unit 32 are different, appropriate materials for making the first frame 21 and the second frame 31 may be selected according to heat dissipation requirements. With respect to the present invention, if the standard of the first storage unit 22 is PCIe and that of the second storage unit 32 is SATA, the first frame 21 may be made of a plastic material, and the second frame 31 may be made of a metal material; however, the present invention is not limited to the examples above.

To take out the first storage module 2 and the second storage module 3, a cover 14 provided on the host body 10 of the carrier module 1 and configured to cover the first storage module 2 and the second storage module 3 may be first opened, so as to expose the first storage module 2 and the second storage module 3. Then, the first storage module 2 and the second storage module 3 are unplugged. Thus, the cover 14 may serve as a protection cover for blocking liquid or dust from entering the first slot 11 and/or the second slot 12.

Further, in one embodiment, to allow the first storage module 2 and the second storage module 3 to be easily unplugged from the first slot 11 and the second slot 12, the first frame 21 may include a first body portion 211 and a first pull rod 212 provided on the first body portion 211, and the second frame 31 may include a second body portion 311 and a second pull rod 312 provided on the second body portion 311. With respect to the present invention, the first pull rod 212 may rotate relative to the first body portion 211 along a first predetermined axial line A1, and the second pull rod 312 may rotate relative to the second body portion 311 along a second predetermined axial line A2, such that the first pull rod 212 and the second pull rod 312 may be rotated out of the first frame 21 and the second frame 31, respectively, allowing the user to take out the first storage module 2 and the second storage module 3 by pulling the first pull rod 212 and the second pull rod 312.

Again refer to FIG. 5 to FIG. 10. Further, the circuit board 13 includes a substrate 130 provided on the carrier module 1, a first connection port 131 provided on the substrate 130, a second connection port 132 provided on the substrate 130, and a third connection port 133 provided on the substrate 130. The first frame 21 may further include a first signal connection terminal 214 provided at the first body portion 211 and extending toward the predetermined direction (the negative Y direction). The second frame 31 may further include a second signal connection terminal 314 provided at the second body portion 311 and extending toward the predetermined direction (the negative Y direction), and a third signal connection terminal 315 provided at the second body portion 311 and extending toward the predetermined direction (the negative Y direction). Thus, when the first storage module 2 and the second storage module 3 are respectively disposed in the first slot 11 and the second slot 12, the first signal connection terminal 214 may be connected to the first connection port 131, the second signal connection terminal 314 may be connected to the second connection port 132, and the third signal connection terminal 315 may be connected to the third connection port 133. Furthermore, it should be noted that, although the first storage module 2 including one signal connection terminal (the first signal connection terminal 214) and the second storage module 3 including two signal connection terminals (the second signal connection terminal 314 and the third signal connection terminal 315) are given as an example in this embodiment, the present invention does not limit the numbers of the signal connection terminals included in the first storage module 2 and the second storage module 3.

Furthermore, it should be noted that, in a preferred embodiment of the present invention, the first storage module 2 and the second storage module 3 are fixed on the carrier module 1 by way of connecting the first signal connection terminal 214 to the first connection port 131, connecting the second signal connection terminal 314 to the second connection port 132 and connecting the third signal connection terminal 315 to the third connection port 135, without using other fastening elements such as screws for securing the first storage module 2 and the second storage module 3 on the carrier module 1. Thus, the user is allowed to disassemble or assemble the first storage module 2 and/or the second storage module 3 on the carrier module 1 by directly plugging/unplugging the first storage module 2 and/or the second storage module 3, instead of having to disassemble or assemble the first storage module 2 and/or the second storage module 3 by using other hand tools or electric tools.

For example, assume that the first storage module 2 and the second storage module 3 are storage modules in different standards. To prevent the user from mistakenly placing the storage modules in inappropriate slots, in a preferred embodiment, the first frame 21 may further include a first abutting portion 213 connected to the first body portion 211 and protruding toward a predetermined direction (a negative Y direction), the second frame 31 may further include a second abutting portion 313 connected to the second body portion 311 and protruding toward the predetermined direction (the negative Y direction), the first slot 11 may further include a first stopping portion 1120 corresponding to the first abutting portion 213, and the second slot 12 may further include a second stopping portion 1220 corresponding to the second abutting portion 313. Thus, when the first signal connection terminal 214 is connected to the first connection port 131 provided in the carrier module 1, the first abutting portion 213 may be abutted against the first stopping portion 1120. Furthermore, when the second signal connection terminal 314 is connected to the second connection port 132 provided in the carrier module 1 and the third signal connection terminal 315 is connected to the third connection port 133 provided in the carrier module 1, the second abutting portion 313 may be abutted against the second stopping portion 1220.

For example, with respect to the present invention, the first abutting portion 213 may be provided on one side of the first signal connection terminal 214 and near the first signal connection terminal 214, and the second abutting portion 313 may be provided between the second signal connection terminal 314 and the third signal connection terminal 315; however, the present invention is not limited to the example above. Furthermore, it should be noted that, the first abutting portion 213 and the second abutting portion 313 have arrangement positions on the first body portion 211 and the second body portion 311 and/or structural shapes different from each other. Thus, using the differences between the first abutting portion 213 and the second abutting portion 313, the user may be prevented from mistakenly placing the storage modules in inappropriate slots and thus avoiding damage of the first storage module 2 and the second storage module 3. That is to say, the differences between the first abutting portion 213 and the second abutting portion 313 are used as foolproof mechanism.

Figure 11:
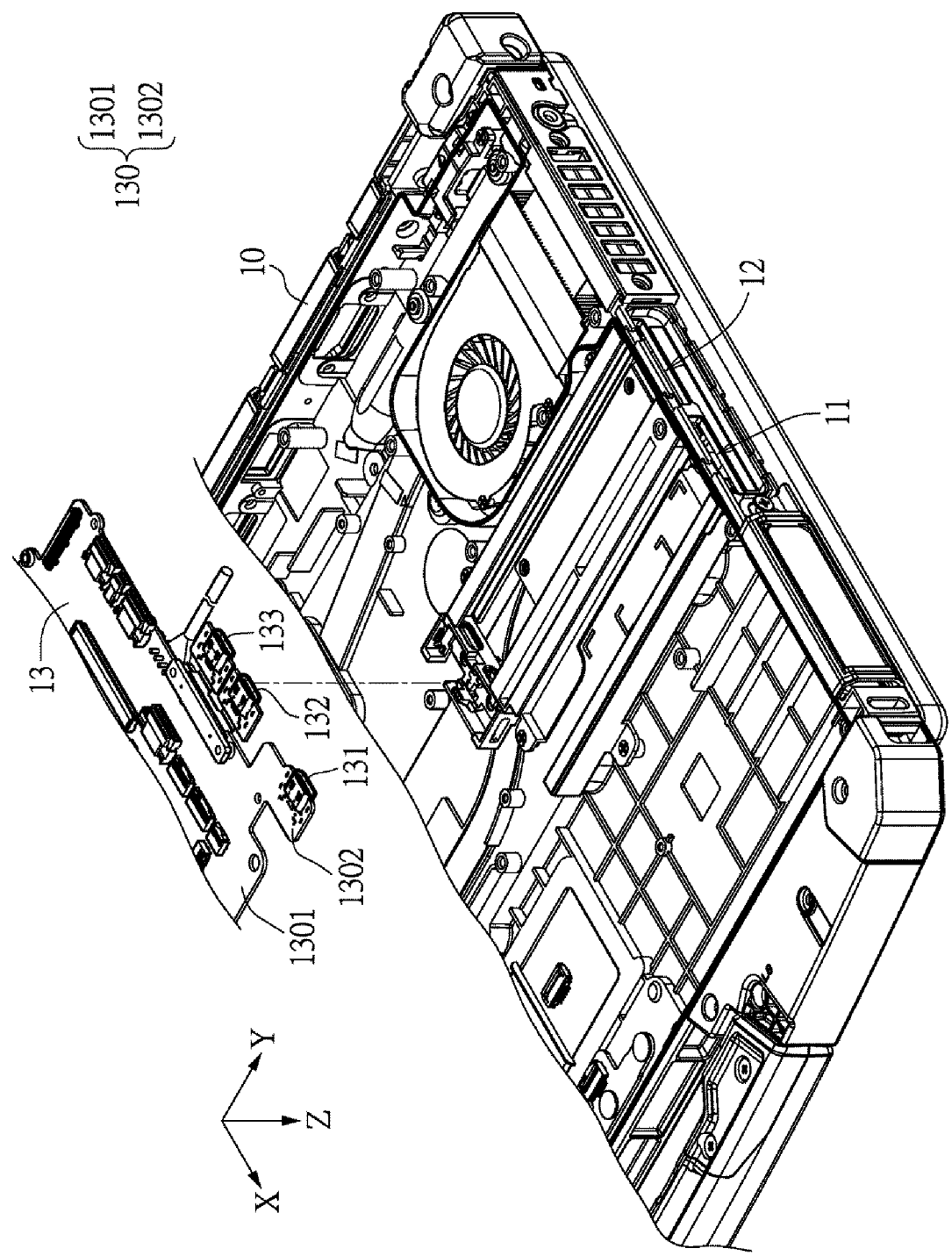
FIG. 11 is another three-dimensional exploded schematic diagram of an electronic device according to an embodiment of the present invention.

Referring to FIG. 11, FIG. 11 shows a three-dimensional exploded schematic diagram of an electronic device according to an embodiment of the present invention. Preferably, due to inevitable tolerances of the electronic device U during the processes of manufacturing and/or assembly, the first connection port 131 of the embodiment of the present invention may be provided on a suspended end portion 1302 of the substrate 130. In other words, the suspended end portion 1302 of the substrate 130 may be provided on a body 1301 of the substrate 130, and the suspended end portion 1302 is arranged in a suspended manner relative to the host body 10 of the carrier module 1. Hence, the suspended end portion 1302 may flex relative to the body 1301 of the substrate 130 or the host body 10 of the carrier module 1. Thus, when the first storage module 2 is plugged in the first slot 11, the issue of alignment accuracy caused by tolerances may be prevented by using the feature that the first connection port 131 is provided on the suspended end portion 1302 of the substrate 130.

Figure 12:
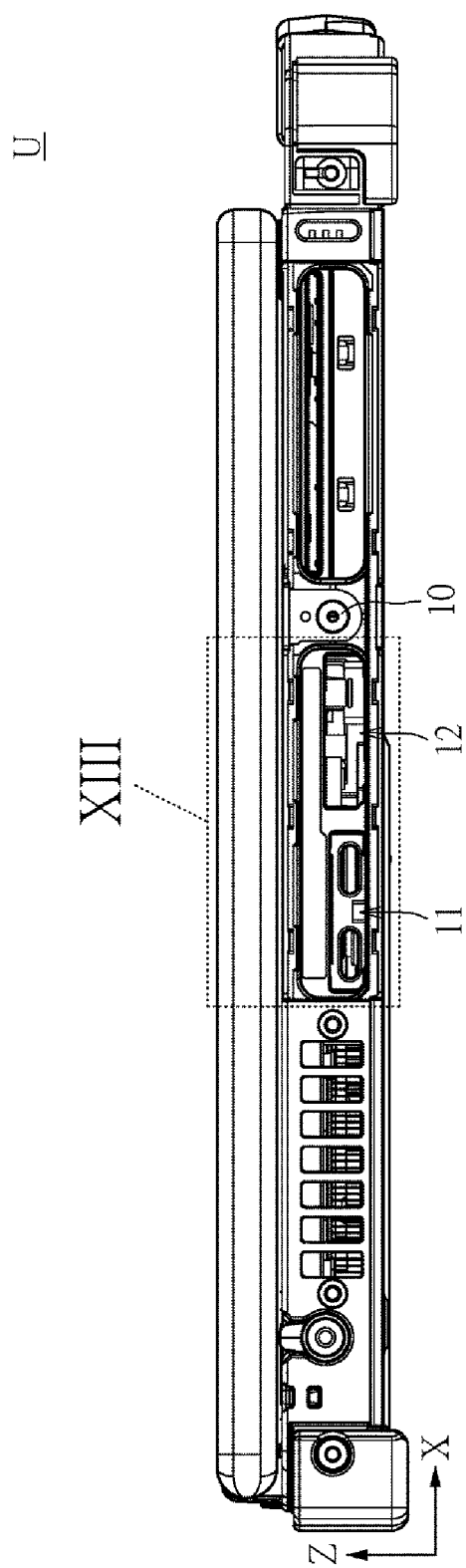
FIG. 12 is a side schematic diagram of an electronic device according to an embodiment of the present invention.
Figure 13:
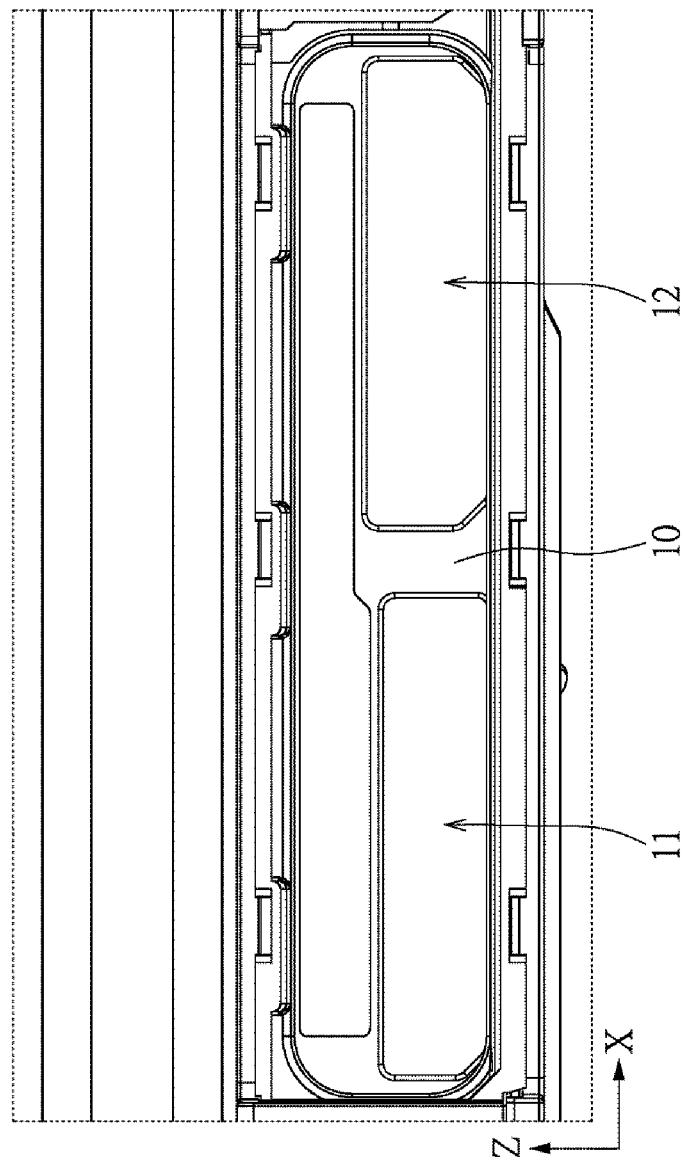
FIG. 13 is an enlarged schematic diagram of part XIII in FIG. 12.
Figure 14:
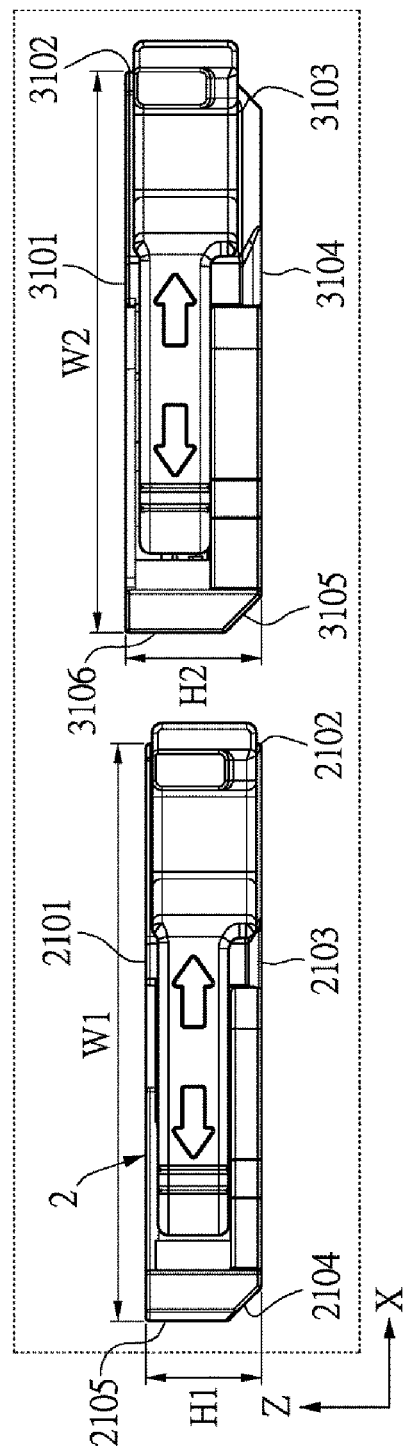
FIG. 14 is a side schematic diagram of the first storage module and the second storage module in FIG. 9.

Refer to FIG. 12 to FIG. 14. FIG. 12 is a side schematic diagram of an electronic device according to an embodiment of the present invention. FIG. 13 is an enlarged schematic diagram of part XIII in FIG. 12. FIG. 14 is a side schematic diagram of the first storage module and the second storage module in part XIV in FIG. 9. It should be noted that, the cover 14 is omitted from FIG. 12 and FIG. 13 in order to show the first slot 11 and the second slot 12. Further, for example, with respect to the present invention, the first slot 11 has a first shape feature, and the second slot 12 has a second shape feature, wherein the first shape feature is different from the second shape feature. Furthermore, the first storage module 2 has a third shape feature corresponding to the first shape feature, and the second storage module 3 has a fourth shape feature corresponding to the second shape feature, wherein the third shape feature is different from the fourth shape feature. Thus, with respect to the present invention, in one embodiment, the first storage module 2 may be plugged in the first slot 11, further connecting the first signal connection terminal 214 of the first storage module 2 to the first connection port 131 in the first slot 11. However, the first storage module 2 cannot be plugged in the second slot 12, in a way that the first signal connection terminal 214 of the first storage module 2 cannot be connected to the second connection port 132 or the third connection port 133 in the second slot 12. Furthermore, the second storage module 3 may be plugged in the second slot 12, further connecting the second signal connection terminal 314 and the third signal connection terminal 315 of the second storage module 3 to the second connection port 132 and the third connection port 133 in the second slot 12. However, the second storage module 3 cannot be plugged in the first slot 11, in a way that the second signal connection terminal 314 and/or the third signal connection terminal 315 of the second storage module 3 cannot be connected to the first connection port 131 in the first slot 11.

Hence, the user not only is able to distinguish the differences between the first storage module 2 and the second storage module 3 based on the third shape feature of the storage module 2 and the fourth shape feature of the second storage module 3, but also is prevented from plugging the first storage module 2 in the second slot 12 or prevented from plugging the second storage module 3 in the first slot 11 and hence from causing damage of the first storage module 2 and/or the second storage module 3.

Further, again referring to FIG. 7 and FIG. 10 to FIG. 14, the first frame 21 of the first storage module 2 has the third shape feature corresponding to the first shape feature, and the second frame 31 of the second storage module 3 has the fourth shape feature corresponding to the second shape feature. Thus, using the shape features of the first frame 21 and the second frame 31 of the present invention, the first frame 21 and the second frame 31 may be plugged in the first slot 11 and the second slot 12 having the corresponding shape features.

For example, the first slot 11 includes a first insert port 111 exposed outside the carrier module 1, the second slot 12 includes a second insert port 121 exposed outside the carrier module 1, the first shape feature includes the shape of the first insert port 111, and the second shape feature includes the shape of the second insert port 121. Hence, the first storage module 2 may be plugged in the first insert port 111, and the second storage module 3 may be plugged in the second insert port 121. Furthermore, for example, with respect to the present invention, the shape of the first insert port 111 is different from the shape of the second insert port 121.

For example, the first slot 11 further includes a first slot bottom 112, the second slot 12 further includes a second slot bottom 122, the first shape feature includes the shape of the first slot bottom 112, and the second shape feature includes the shape of the second slot bottom 122. Thus, the first storage module 2 may be plugged in a direction from the first insert port 111 toward the first slot bottom 112 such that the first signal connection terminal 214 of the first storage module 2 may be connected to the first connection port 131, and the second storage module 3 may be plugged in a direction from the second insert port 121 toward the second slot bottom 122 such that the second signal connection terminal 314 and the third signal connection terminal 315 of the second storage module 3 may be electrically connected to the second connection port 132 and the third connection port 133. Furthermore, for example, with respect to the present invention, the shape of the first slot bottom 112 is different from the shape of the second slot bottom 122.

Again referring to FIG. 13 and FIG. 14, the first insert port 111 has a first predetermined width W1 and a first predetermined height H1, and the second insert port 121 has a second predetermined width W2 and a second predetermined height H2. For example, the first predetermined width W1 is less than the second predetermined width W2, and the first predetermined height H1 is more than the second predetermined height H2. However, it should be noted that, in other embodiments, the first predetermined width W1 may also be more than the second predetermined width W2, and the first predetermined height H1 may be less than the second predetermined height H2. Furthermore, for example, with respect to the present invention, the first insert port 111 may be a hexagon, and the second insert port 121 may be a pentagon. However, it should be noted that, the present invention does not limit the actual dimensions of the first slot 11 and the second slot 12, or the actual shapes of the first insert port 111, the second insert port 121, the first slot bottom 112 and the second slot bottom 122 of the first slot 11 and the second slot 12. In other words, in a preferred embodiment, the first shape feature of the first slot 11 may also be different from the second shape feature of the second slot 12.

Furthermore, the first storage module 2 has a first predetermined width W3 and a first predetermined height H3, and the second storage module 3 has a second predetermined width W4 and a second predetermined height H4. For example, the first predetermined width W3 is less than the second predetermined width W4, and the first predetermined height H3 is more than the second predetermined height H4. However, it should be noted that, in other embodiments, the first predetermined width W3 may also be more than the second predetermined width W4, and the first predetermined height H3 may be less than the second predetermined height H4. Furthermore, for example, with respect to the present invention, a cross section of the first storage module 2 perpendicular to the predetermined direction (the negative Y direction) may correspond to the hexagon of the first insert port 111 (for example, a first side 2101, a second side 2102, a third side 2103, a fourth side 2104 and a fifth side 2105), and a cross section of the second storage module 3 perpendicular to the predetermined direction (the negative Y direction) may correspond to the pentagon of the second insert port 121 (for example, a first side 3101, a second side 3102, a third side 3103, a fourth side 3104, a fifth side 3105 and a sixth side 3106). However, it should be noted that, the present invention does not limit the actual dimensions of the first storage module 2 and the second storage module 3, and does not limit the actual shapes of the cross section of the first storage module 2 perpendicular to the predetermined direction (the negative Y direction) and the cross section of the second storage module 3 perpendicular to the predetermined direction (the negative Y direction). In other words, in a preferred embodiment, the third shape feature of the first storage module 2 may be different from the fourth shape feature of the second storage module 3.

Figure 15:
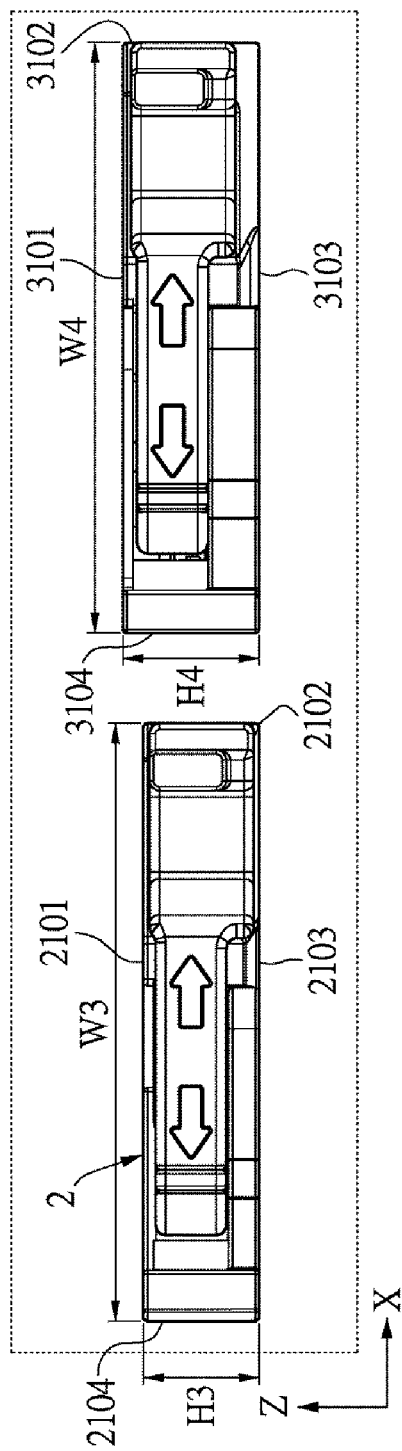
FIG. 15 is a side schematic diagram of a first storage module and a second storage module of an electronic device according to another embodiment of the present invention.

Refer to FIG. 15 showing a side schematic diagram of a first storage module and a second storage module of an electronic device according to another embodiment of the present invention. It is known by comparing FIG. 14 and FIG. 15 that, in the embodiment in FIG. 15, the cross section of the first storage module 2 perpendicular to the predetermined direction (the negative Y direction) may be a rectangle (for example, a first side 2101, a second side 2102, a third side 2103 and a fourth side 2104), and the cross section of the second storage module 3 perpendicular to the predetermined direction (the negative Y direction) may be a rectangle (for example, a first side 3101, a second side 3102, a third side 3103 and a fourth side 3104). However, the actual dimensions of the first storage module 2 and the second storage module 3 are different; that is, the third shape feature of the first storage module 2 is different from the fourth shape feature of the second storage module 3. Furthermore, it should be noted that, as shown in FIG. 15, if the cross section of the first storage module 2 perpendicular to the predetermined direction (the negative Y direction) is a rectangle, the first slot 11 also has the first shape feature corresponding to the first storage module 2, such that the first storage module 2 may be pluggably disposed in the first slot 11. Meanwhile, if the cross section of the second storage module 3 perpendicular to the predetermined direction (the negative Y direction) is a rectangle, the second slot 12 also has the second shape feature corresponding to the second storage module 3, such that the second storage module 3 may be pluggably disposed in the second slot 12.

Benefits of the Embodiments

One benefit provided by the present invention is that, the electronic device U provided by the present invention allows a user to easily distinguish the differences between the first storage module 2 and the second storage module 3 by the technical solutions "the first slot 11 has a first shape feature, and the second slot 12 has a second shape feature, wherein the first shape feature is different from the second shape feature," "the first storage module 2 has a third shape feature corresponding to the first shape feature," "the second storage module 3 has a fourth shape feature corresponding to the second shape feature," and "the third shape feature is different from the fourth shape feature".

Further, a user is allowed to place or remove the first storage module 2 and the second storage module 3 in or from the carrier module 1 by means of plugging/unplugging, thus enhancing convenience for replacing or detaching the first storage module 2 and the second storage module 3, and at the same time enhancing protection for information security.

Further, the suspended end portion 1302 may flex relative to the body 1301 of the substrate 130 or the host body 10 of the carrier module 1. Thus, when the first storage module 2 is plugged in the first slot 11, the issue of alignment accuracy caused by tolerance may be eliminated by the feature of the first connection port 131 provided on the suspended end portion 1302 of the substrate 130.

The disclosure above demonstrates merely preferred embodiments of the present invention and shall not be construed as limitations to the claims of the present invention. Therefore, any equivalent technical changes made to the details disclosed by the description and drawings of the present invention are encompassed within the scope of the appended claims of the present invention.

What is claimed is:

1. An electronic device, comprising:
a carrier module, comprising a first slot and a second slot, wherein the first slot has a first shape feature, the second slot has a second shape feature, and the first shape feature is different from the second shape feature;
a first storage module, detachably disposed in the first slot, the first storage module having a third shape feature corresponding to the first shape feature; and
a second storage module, detachably disposed in the second slot, the second storage module having a fourth shape feature corresponding to the second shape feature;
wherein, the third shape feature is different from the fourth shape feature;
wherein the first storage module comprises a first frame and a first storage unit provided on the first frame, and the first frame has a third shape feature corresponding to the first shape feature;
wherein the second storage module comprises a second frame and a second storage unit provided on the second frame, and the second frame has a fourth shape feature corresponding to the second shape feature;
wherein the first frame comprises a first body portion, a first abutting portion connected to the first body portion and protruding toward a predetermined direction, and a first signal connection terminal provided at the first body portion and extending toward the predetermined direction;
wherein the first slot comprises a first stopping portion corresponding to the first abutting portion, arranged such that when the first signal connection terminal is connected to a first connection port provided in the carrier module, the first abutting portion is abutted against the first stopping portion;
wherein the second frame comprises a second body portion, a second abutting portion connected to the second body portion and protruding toward the predetermined direction, a second signal connection terminal provided at the second body portion and extending toward the predetermined direction, and a third signal connection terminal provided at the second body portion and extending toward the predetermined direction; and
wherein the second slot comprises a second stopping portion corresponding to the second abutting portion, arranged such that when the second signal connection terminal is connected to a second connection port provided in the carrier module and the third signal connection terminal is connected to a third connection port provided in the carrier module, the second abutting portion is abutted against the second stopping portion.

2. The electronic device according to claim 1, wherein the first slot comprises a first insert port exposed outside the carrier module, and the second slot comprises a second insert port exposed outside the carrier module; the first shape feature has a shape of the first insert port, the second shape feature has a shape of the second insert port, and the shape of the first insert port is different from the shape of the second insert port.

3. The electronic device according to claim 1, wherein the first slot comprises a first slot bottom, and the second slot comprises a second slot bottom; the first shape feature has a shape of the first slot bottom, the second shape feature has a shape of the second slot bottom, and the shape of the first slot bottom is different from the shape of the second slot bottom.

4. The electronic device according to claim 1, wherein the first slot comprises a first insert port exposed outside the carrier module, and the second slot comprises a second insert port exposed outside the carrier module; the first insert port has a first predetermined width and a first predetermined height, and the second insert port has a second predetermined width and a second predetermined height; the first predetermined width is less than the second predetermined width, and the first predetermined height is more than the second predetermined height.

5. The electronic device according to claim 1, wherein the first slot comprises a first insert port exposed outside the carrier module, and the second slot comprises a second insert port exposed outside the carrier module; the first insert port is hexagonal, and the second insert port is pentagonal.

6. The electronic device according to claim 1, wherein the carrier module further comprises a circuit board; the circuit board comprises a substrate provided on the carrier module, the first connection port provided on the substrate, the second connection port provided on the substrate, and the third connection port provided on the substrate.

7. The electronic device according to claim 6, wherein the first connection port is provided on a suspended end portion of the substrate.

* * * * *